(12) United States Patent
Sforzin et al.

(10) Patent No.: US 12,087,391 B2
(45) Date of Patent: Sep. 10, 2024

(54) DRIFT COMPENSATION FOR CODEWORDS IN MEMORY

(71) Applicant: Micron Technology, Inc., Boise, ID (US)

(72) Inventors: Marco Sforzin, Cernusco Sul Naviglio (IT); Paolo Amato, Treviglio (IT); Luca Barletta, Gallarate (IT); Marco Pietro Ferrari, Milan (IT); Antonino Favano, Brolo (IT)

(73) Assignee: Micron Technology, Inc., Boise, ID (US)

( * ) Notice: Subject to any disclaimer, the term of this patent is extended or adjusted under 35 U.S.C. 154(b) by 175 days.

(21) Appl. No.: 17/948,423

(22) Filed: Sep. 20, 2022

(65) Prior Publication Data
US 2024/0071434 A1    Feb. 29, 2024

Related U.S. Application Data

(60) Provisional application No. 63/402,317, filed on Aug. 30, 2022.

(51) Int. Cl.
*G11C 7/10* (2006.01)
*G11C 11/56* (2006.01)

(52) U.S. Cl.
CPC .......... *G11C 7/1063* (2013.01); *G11C 7/1057* (2013.01); *G11C 7/1069* (2013.01); *G11C 11/5621* (2013.01)

(58) Field of Classification Search
CPC ... G11C 7/1063; G11C 7/1057; G11C 7/1069; G11C 11/5621
See application file for complete search history.

(56) References Cited

U.S. PATENT DOCUMENTS 9,030,870 B2 * 5/2015 Moschiano ........ G11C 16/3418
365/185.24
9,875,044 B2 * 1/2018 Lee ..................... G06F 16/9535
(Continued)

OTHER PUBLICATIONS

Schouhamer Immink, et al., "Minimum Pearson Distance Detection for Multilevel Channels With Gain and/or Offset Mismatch", IEEE Transactions on Information Theory, issue 10, vol. 60, Oct. 2014, pp. 5966-5974.
(Continued)

*Primary Examiner* — Son L Mai
(74) *Attorney, Agent, or Firm* — Brooks, Cameron & Huebsch, PLLC

(57) ABSTRACT

Systems, methods, and apparatuses are provided for drift compensation for codewords in memory. A memory device comprises memory cells and circuitry configured to sense a codeword stored in the memory cells. The circuitry is further configured to determine a value of a cell metric of each memory cell of the sensed codeword, wherein the value of the cell metric of each of the memory cells is determined based on a summation of a threshold voltage value of each of the memory cells, a mean of the threshold voltage values of the memory cells, and a value proportional to the mean of the threshold voltage values of the memory cells. The circuitry is further configured to determine which cell metric of each of the memory cells has a lowest value, input that cell metric into a Pearson detector, and determine the originally programmed data of the codeword using the Pearson detector.

25 Claims, 6 Drawing Sheets

(56) References Cited

U.S. PATENT DOCUMENTS 10,431,301 B2 10/2019 Mirichigni et al.
10,566,052 B2 2/2020 Mirichigni et al.
10,714,185 B2 7/2020 Sforzin et al.
10,976,936 B2 4/2021 Sforzin et al.
11,164,619 B2 11/2021 Sforzin et al.

OTHER PUBLICATIONS

Schouhamer Immink, et al., "Dynamic Threshold Detection Based on Pearson Distance Detection", IEEE Transactions on Communications, issue 7, vol. 66, Jul. 2018, pp. 2958-2965.
Bu Renfei, et al., "Minimum Pearson Distance Detection Using a Difference Operator in the Presence of Unknown Varying Offset", IEEE Communications Letters, IEEE Service Center, Piscataway, NJ, USA, vol. 23, No. 7, Jul. 1, 2019, 4 pages.
Schouhamer Immink Kees, et al., "Minimum Pearson Distance Detection Using Mass-Centered Codewords in the Presence of Unknown Varying Offset", IEEE Journal on Selected Areas in Communications, IEEE Service Center, Piscataway, NJ, USA, vol. 34, No. 9, Sep. 1, 2016, 8 pages.

* cited by examiner

DRIFT COMPENSATION FOR CODEWORDS IN MEMORY

PRIORITY INFORMATION

This application claims the benefit of U.S. Provisional Application Ser. No. 63/402,317 filed on Aug. 30, 2022, the contents of which are incorporated herein by reference.

TECHNICAL FIELD

The present disclosure relates generally to semiconductor memory and methods, and more particularly, to drift compensation for codewords in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one data bit).

DETAILED DESCRIPTION

Figure 1A:
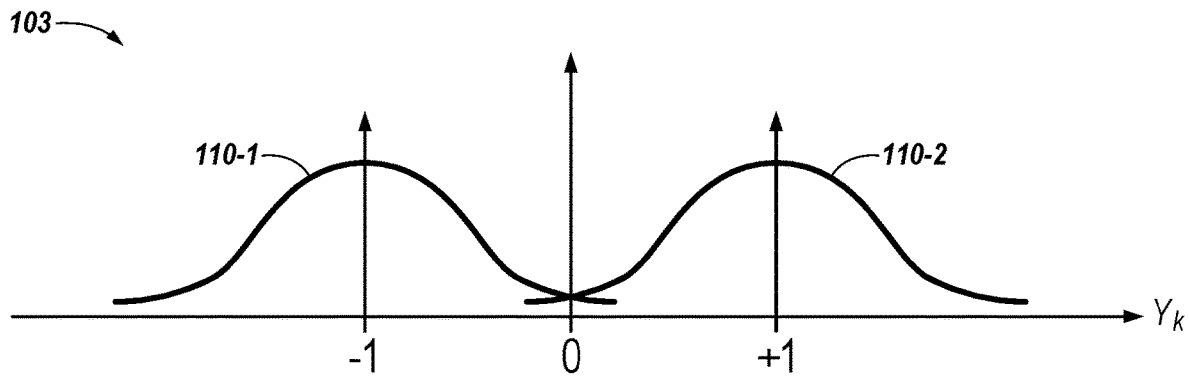
FIGS. 1A and 1B illustrate diagrams of a number of threshold voltage distributions, sensing voltages, and data assignments associated with a group of memory cells in accordance with an embodiment of the present disclosure.

The present disclosure includes apparatuses, methods, and systems for drift compensation for codewords in memory. An embodiment includes a memory device comprising an array of memory cells and circuitry configured to sense a codeword stored in the array of memory cells, determine a value of a cell metric of each memory cell of the sensed codeword, wherein the value of the cell metric of each of the memory cells is determined based on a summation of a threshold voltage value of each of the memory cells, a mean of the threshold voltage values of the memory cells, and a value proportional to the mean of the threshold voltage values of the memory cells. The circuitry is further configured to determine which cell metric of each of the memory cells has a lowest value, input the cell metric determined to have the lowest value to a Pearson detector, and determine originally programmed data of the codeword using the Pearson detector.

A memory device can address memory cells for operations (e.g., sense and program operations) in groups (e.g., packets) called words or codewords. As memory cells are sensed and programmed, their response to positive or negative electrical pulses can change cycle after cycle (e.g., according to a specific electrical bias history of the codeword to which they belong).

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to a reference signal, which may be, for instance, a reference voltage. The reference voltage may correspond to a voltage positioned between an expected voltage level of the signal output by a memory cell programmed to a first data state (e.g., storing a first logic value) and an expected voltage level of the signal output by a memory cell programmed to a second data state (e.g., storing a second logic value). For instance, the sense circuitry may determine that the memory cell has been programmed to a first data state if the signal output by the memory cell is less than the reference voltage, and that the memory cell has been programmed to a second data state if the signal output by the memory cell is greater than the reference voltage.

If, however, the memory cell experiences threshold voltage drift, the threshold voltage value of the memory cell may change such that the signal output by the memory cell during a sense operation does not correspond to the data state to which the memory cell was programmed (e.g., is no longer the expected value of a signal output by a memory cell programmed to that data state). As used herein, "drift" refers to a difference between the programmed threshold voltage value of a memory cell and the sensed threshold voltage value of the memory cell. Threshold voltage drift can occur in a memory cell after multiple operations (e.g., multiple read cycles) are performed on the memory cell and/or due to temperature variations in the memory cell, for example. Threshold voltage drift can lead to an incorrect read in a memory cell. For instance, threshold voltage drift may result in the memory cells of a codeword being sensed to be in states to which they were not actually programmed (e.g., a cell programmed to be in the first data state may be erroneously sensed to be in the second data state, and/or vice versa). Such erroneous data sensing can reduce the performance and/or lifetime of the memory.

Embodiments of the present disclosure, however, can compensate for threshold voltage drift that may occur in the memory cells of a codeword, such that the data states of the memory cells of the codeword can be accurately determined. For example, embodiments of the present disclosure can use a Pearson detector to determine the originally programmed data of a codeword whose memory cells have been affected by threshold voltage drift. Accordingly, embodiments of the present disclosure can increase the performance and/or lifetime of memory that utilizes codewords (e.g., by estimating the original value of the data bits in a codeword that has been affected by threshold voltage drift.

As used herein, "a," "an," or "a number of" can refer to one or more of something, and "a plurality of" can refer to two or more such things. For example, a memory device can refer to one or more memory devices, and a plurality of memory devices can refer to two or more memory devices. Additionally, the designator "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1B:
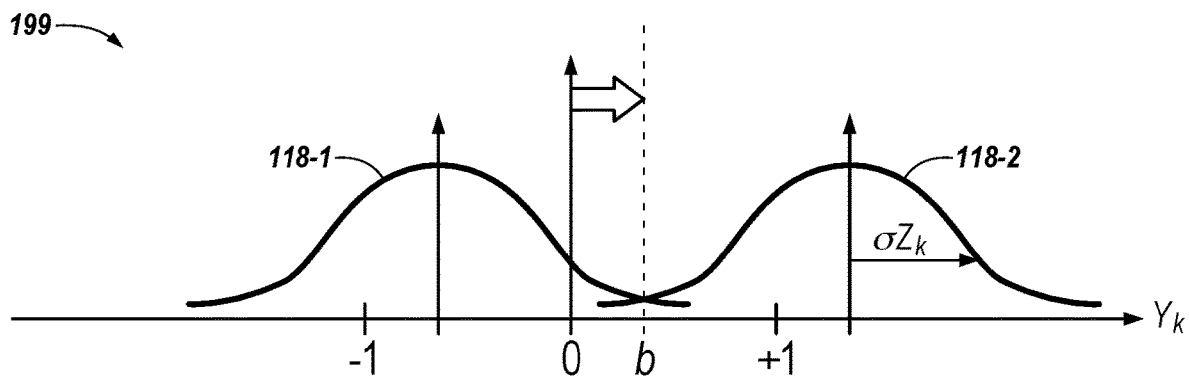

FIGS. 1A and 1B illustrate diagrams of a number of threshold voltage (Vt) distributions, sensing voltages, and data assignments associated with a group of memory cells in accordance with an embodiment of the present disclosure. The group of memory cells can be, for example, a codeword, which can refer to a logical unit of a memory device used to store data. FIG. 1A illustrates a diagram 103 of Vt distributions 110-1 and 110-2 associated with the data states of the memory cells of a codeword before the memory cells of the codeword have experienced threshold voltage drift, and FIG. 1B illustrates a diagram 199 of Vt distributions 118-1 and 118-2 associated with codeword after the memory cells of the codeword have experienced threshold voltage drift.

As an example, the two Vt distributions 110-1 and 110-2 shown in FIG. 1A, and the two Vt distributions 118-1 and 118-2 shown in FIG. 1B, can correspond to single level (e.g., two-state) memory cells. However, embodiments of the present disclosure are not limited to single level memory cells. For example, embodiments of the present disclosure can include multilevel cells such as, for instance, triple level cells (TLCs), or quadruple level cells (QLCs). In such examples, the diagrams illustrated in FIGS. 1A and 1B would include additional Vt distributions (e.g., corresponding to each of the additional data states).

Vt distributions 110-1 and 110-2 shown in FIG. 1A, and Vt distributions 118-1 and 118-2 shown in FIG. 1B, represent two target data states (e.g., 1 and 0, respectively, which are represented in FIGS. 1A and 1B by −1 and 1, respectively) to which the memory cells of the group can be programmed. Embodiments of the present disclosure, however, are not limited to these data assignments.

Vt distributions 110-1 and 110-2 shown in FIG. 1A, and Vt distributions 118-1 and 118-2 shown in FIG. 1B, can represent a quantity (e.g., number) of memory cells of the group that are programmed to the corresponding target states (e.g., 1 and 0), with the height of a Vt distribution curve indicating the quantity of cells programmed to a particular voltage within the Vt distribution (e.g., on average). The width of the Vt distribution curve indicates the range of voltages that represent a particular target state (e.g., the width of the Vt distribution curves 110-2 and 118-2 represent the range of voltages that correspond to a data value of 0 for the original codeword (e.g. before the codeword has experienced threshold voltage drift) and the codeword after it has experienced threshold voltage drift, respectively). In the example illustrated in FIG. 1A (e.g., the original codeword), the widths and heights of Vt distributions 110-1 and 110-2 are equivalent (e.g., equal). Further, in the example illustrated in FIG. 1B (e.g., the codeword that has experienced drift), the widths and heights of Vt distributions 118-1 and 118-2 are equivalent.

During a sense (e.g., read) operation to determine the respective data states stored by the memory cells of the group, a reference voltage located between the two Vt distributions (e.g., at location 0 illustrated in FIG. 1A) can be used to distinguish between the two data states (e.g., between states 1 and 0). For example, during a sense operation performed on a selected memory cell of the group, a sense voltage can be applied to first signal line (e.g., an access line) to which the memory cell is coupled, and the resulting voltage signal (e.g. in response to the sense voltage being applied to the access line) from the memory cell can be provided to sense circuitry via a second signal line (e.g., a sense line) to which the memory cell is coupled for comparison with the reference voltage. The data state for the selected memory cell can be determined using (e.g., by comparing) the voltage signal from that memory cell and the reference voltage.

In the examples illustrated in FIGS. 1A and 1B, the reference voltage used to distinguish between the two data states can be determined by averaging the threshold voltages of the memory cells of the group (e.g., codeword). For the original codeword (e.g., whose cells have not experienced threshold voltage drift), this reference voltage would be located exactly between its Vt distributions 110-1 and 110-2 at 0, as illustrated in FIG. 1A. However, for the codeword whose memory cells have experienced drift, this reference voltage would be located exactly between its Vt distributions 118-1 and 118-2 at b instead of 0, which is illustrated in FIG. 1B. As such, using 0 as the reference voltage to sense the data states of the memory cells of the codeword that has experienced drift may result in some cells of that codeword being sensed to be in a state to which they were not actually programmed to. For instance, a cell programmed to a target state of 1, but whose voltage is to the right of 0 (e.g., the reference voltage in FIG. 1A) within distribution 118-1, may be erroneously sensed to be in state 0.

Embodiments of the present disclosure, however, can compensate for this threshold voltage drift by determining (e.g., estimating) the original (e.g., expected) data bits of a codeword that has experienced threshold voltage drift. Estimating the originally programmed data of the codeword can reduce the likelihood of the data states of the memory cells in the codeword being read incorrectly when the memory cells have experienced threshold voltage drift.

Figure 2:
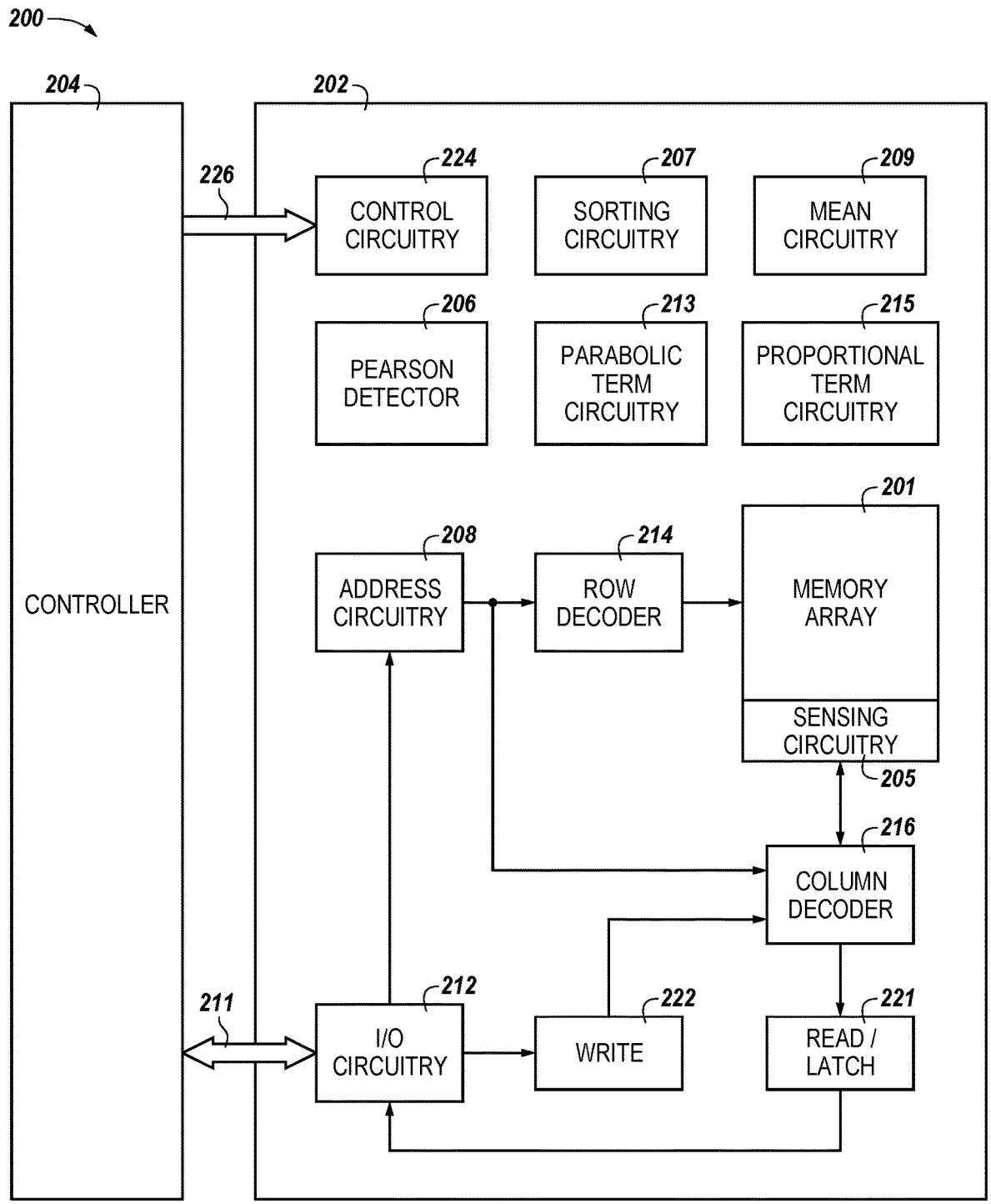
FIG. 2 is a block diagram illustration of an example apparatus in accordance with an embodiment of the present disclosure.

FIG. 2 is a block diagram illustration of an example apparatus, such as an electronic memory system 200, in accordance with an embodiment of the present disclosure. Memory system 200 may include an apparatus, such as a memory device 202 and a controller 204, such as a memory controller (e.g., a host controller). Controller 204 might include a processor, for example. Controller 204 might be coupled to a host, for example, and may receive command signals (or commands), address signals (or addresses), and data signals (or data) from the host and may output data to the host.

Memory device 202 includes a memory array 201 of memory cells. For example, memory array 201 can include a group of memory cells, such as a codeword, as previously described herein (e.g., in connection with FIGS. 1A-1B). Memory array 201 can be, for example, a DRAM array, such as, for instance, a ferroelectric memory (e.g., FeRAM) array. That is, the memory cells of array 201 can be DRAM (e.g., FeRAM) cells. However, embodiments are not limited to a particular type of memory array. For instance, in some embodiments, memory array 201 can be a NAND flash array (e.g., the memory cells of array 201 can be NAND flash memory cells). Further, although one memory array 201 is illustrated in FIG. 2 for simplicity and so as not to obscure embodiments of the present disclosure, memory device 202 can include a number of memory arrays analogous to array 201.

Memory device 202 may include address circuitry 208 to latch address signals provided over I/O connections 211 through I/O circuitry 212. Address signals may be received and decoded by a row decoder 214 and a column decoder 216 to access the memory array 201. For example, row decoder 214 and/or column decoder 216 may include drivers.

Controller 204 may sense (e.g., read) data in memory array 201, such as a codeword stored in array 201, by using read/latch circuitry 221 and/or sensing circuitry 205. Read/latch circuitry 221 may read and latch data from the memory array 201. Sensing circuitry 205 may include a number of sense amplifiers coupled to memory cells of memory array 201, which may operate in combination with the read/latch circuitry 221 to sense (e.g., read) memory states from targeted memory cells. I/O circuitry 212 may be included for bi-directional data communication over the I/O connections 211 with controller 204. Write circuitry 222 may be included to program (e.g., write) data to memory array 201.

Control circuitry 224 may decode signals provided by control connections 226 from controller 204. These signals may include chip signals, write enable signals, and address latch signals that are used to control the operations on memory array 201, including data read and data write operations. Control circuitry 224 may be included in controller 204, for example. Controller 204 may include other circuitry, firmware, software, or the like, whether alone or in combination. Controller 204 may be an external controller (e.g., in a separate die from the memory array 201, whether wholly or in part) or an internal controller (e.g., included in a same die as the memory array 201). For example, an internal controller might be a state machine or a memory sequencer.

The memory device 202 can also include circuitry configured to determine (e.g., estimate) the originally programmed data of a codeword (e.g., a sensed codeword) that has experienced threshold voltage drift. For example, the memory device 202 can include sorting circuitry 207, mean circuitry 209, a Pearson detector 206, parabolic term circuitry 213, and proportional term circuitry 215. The sorting circuitry 207 can sort the data bits (e.g., the threshold voltage values of the memory cells) of the codeword into different voltage distributions, the mean circuitry 209 can determine a mean threshold voltage value of the memory cells corresponding to the data bits in the codeword, the parabolic term circuitry 213 can determine a parabolic term of a codeword, proportional term circuitry 215 can determine a value proportional to the mean threshold voltage value of the codeword, and Pearson detector 206 can determine the originally programmed data of the codeword (e.g., the value of the data bits in the originally programmed codeword). In some embodiments, the sorting circuitry 207, mean circuitry 209, Pearson detector 206, parabolic term circuitry 213, and proportional term circuitry 215 can be included in (e.g., located on) a controller (e.g., controller 204) instead of the memory device 202. Mean circuitry 209, parabolic term circuitry 213, and proportional term circuitry 215 will be further described herein (e.g., in connection with FIGS. 4, 5, and 6, respectively).

Determining the originally programmed data of a codeword includes inputting a cell metric determined to have the lowest value relative to the value of other cell metrics into the Pearson detector 206. As used herein, the term "cell metric" refers to a value associated with a memory cell that can be input into a Pearson detector. In some embodiments, the value of the cell metric determined to have the lowest value and a correlation between a tentative codeword and the sensed codeword can be input into the Pearson detector to determine the originally programmed data of the codeword. As used herein, the term "tentative codeword" refers to a codeword that provides the lowest Pearson distance between the sensed codeword and the originally programmed codeword relative to the other codewords in the memory array 201. The sensed codeword can comprise a sensed data value of each of the memory cells of the sensed codeword. The originally programmed data of the codeword can include the programmed data value of each of the memory cells of the codeword (e.g., corresponding to the data bits in the originally programmed codeword).

The Pearson detector 206 can determine the originally programmed data of the codeword by searching for a codeword (e.g., a sensed codeword) that has a lowest Pearson distance from the original codeword relative to other codewords (e.g., other sensed codewords). As used herein, the term "Pearson distance" refers to a measure of the linear correlation between two sets of data (e.g. between two codewords). The Pearson detector can use the sensed codeword that has the lowest Pearson distance from the original codeword to estimate the value of each data bit of the original codeword. In some embodiments, the Pearson detector can determine the lowest Pearson distance using a weight estimator. The weight estimator can be the estimated weight of the original codeword. As used herein, the term "weight" refers to the number of data bits with a particular data value (e.g., the number bits with a value of 1) in a codeword.

In some embodiments, the weight estimator can be a value that minimizes the value of the cell metric. The value of the cell metric for each memory cell of the codeword can be determined based on a summation of the threshold voltage value of each of the memory cells, the mean of the threshold voltage values of the memory cells, and a value proportional to the mean of the threshold voltage values of the memory cells. For example, the value of the cell metric for each memory cell (e.g., each data bit) in the sensed codeword can be determined by the following equation:

$$\delta_w(Y) = \sum_{i=1}^{w}(Y_{i:N}) + \frac{w(N-w)}{N} - \mu_Y w$$

In the foregoing equation, the cell metric for each respective memory cell is represented by the symbol $\delta_w(Y)$. The equation states that the cell metric can be determined by adding the sum of the sorted threshold voltage values of each of the memory cells in the sensed codeword, represented in the foregoing equation as $\sum_{i=1}^{w}(Y_{i:N})$, to a parabolic term, represented in the foregoing equation as $$\frac{w(N-w)}{N},$$

and subtracting a term proportional to the mean $\mu_y$, represented in the foregoing equation as $\mu_y w$. In some embodiments, the value of the parabolic term can be accessed from a lookup table or by an analog circuit, as will be further described herein. The "w" in the foregoing equation can denote the position of a data bit in the sensed codeword (e.g., the position of the threshold voltage value of the memory cell corresponding to the data bit in the sorted threshold voltage values), and "N" can denote the total quantity of memory cells of the codeword. For example, if w has a value of 5, that can indicate that the equation will find the cell metric value for the fifth data bit in the sensed codeword (e.g., for the memory cell whose threshold voltage value is fifth in the sorted threshold voltage values). The cell metric with the lowest value can be the weight estimator. The weight estimator can be input into the Pearson detector 206 to determine the originally programmed data of the codeword. The process for sorting the data bits (e.g., the threshold voltage values of the memory cells) of the sensed codeword in ascending order (e.g., based on the threshold voltage value of the corresponding memory cell) is described in connection with FIG. 3 and the process for determining the mean of the sorted threshold voltage values is described in connection with FIG. 4. Further, the process for determining the parabolic term is described in connection with FIG. 5 and the process for determining the term proportional to the mean of the threshold voltage values is described in connection with FIG. 6. The process for determining the cell metric can be performed by digital or analog processing mechanisms.

The number of data bits in the codeword having a value of 0 can be different than the number of data bits in that same codeword that have a value of 1. In some embodiments, a data bit that has a first value can be added to the codeword if the sensed codeword only comprises data bits having a second value. For example, if the codeword only comprises data bits having a value of 1, a data bit with a value of 0 can be added to the codeword. Alternatively, if the codeword only comprises data bits having a value of 0, a data bit with a value of 1 can be added to the codeword.

Figure 3:
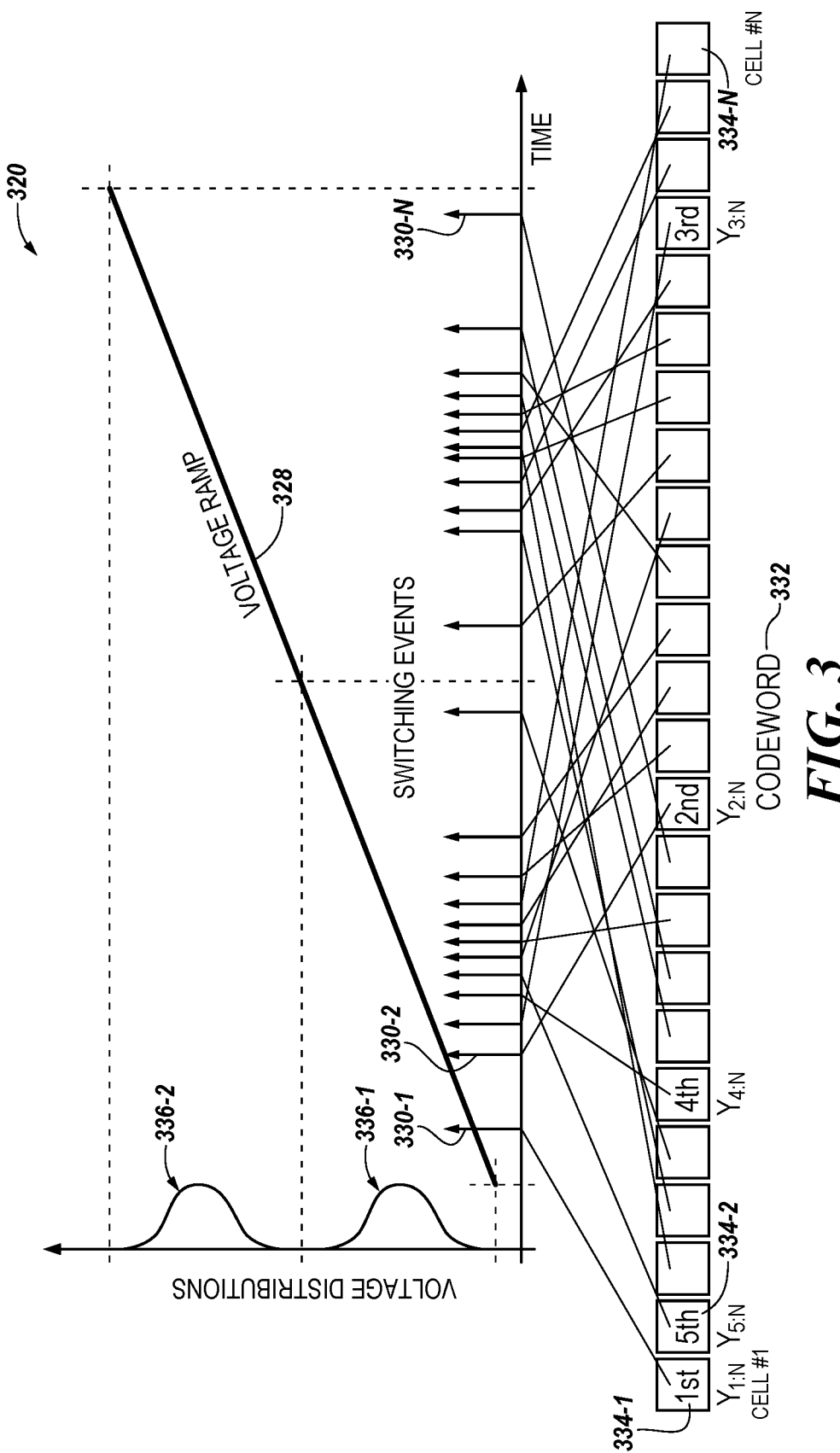
FIG. 3 is a diagram illustrating voltage distributions and corresponding data bits in a codeword in accordance with an embodiment of the present disclosure.

FIG. 3 is a diagram illustrating voltage distributions and corresponding data bits in a codeword in accordance with an embodiment of the present disclosure. FIG. 3 illustrates a diagram 320 including a ramp voltage 328, switching event times 330-1, 330-2, ..., 330-N (individually or collectively referred to as switching event times 330) of data bits 334-1, 334-2, ..., 334-N (individually or collectively referred to as data bits 334) in a codeword 332. The diagram 320 also includes voltage distributions 336-1 and 336-2.

Diagram 320 includes switching event times 330 for data bits 334 of a codeword 332 (e.g., switching event time 330-1 for data bit 334-1, switching event time 330-2 for data bit 334-2, etc.). As used herein, the term "switching event" refers to an occurrence of a memory cell changing from a low conductive state to a high conductive state, or a high conductive state to a low conductive state, in response to receiving a current that has a voltage that is greater than or equal to the threshold voltage of the memory cell. In some embodiments, applying the ramped up voltage 328 (e.g., a voltage that increases with time) to each of the memory cells can initiate a switching event in each of the memory cells at different times. For instance, in the example illustrated in FIG. 3, the memory cell of the codeword corresponding to data bit 334-1 (e.g., $Y_{1:N}$) is the first cell to switch (at switching event time 330-1), the memory cell of the codeword corresponding to data bit $Y_{2:N}$ is the second cell to switch (at switching event time 330-2), and the memory cell of the codeword corresponding to data bit 334-2 is the fifth cell to switch. The threshold voltage value of each of the memory cells can be determined after the switching event occurs in that respective memory cell.

In some embodiments, circuitry (e.g., sorting circuitry 207 in FIG. 2) can sort the threshold voltage values of each of the memory cells in ascending order (e.g., from lowest to highest). Further, the sorted threshold voltage values can be divided into a first distribution 336-1 and second distribution 336-2, with the first distribution including the lower threshold voltage values (e.g., the cells of the codeword with the shorter switching times) and the second distribution including the higher threshold voltage values (e.g., the cells of the codeword with the longer switching times). In some embodiments, the sorted threshold voltages are divided into the first distribution 336-1 and the second distribution 336-2 such that the quantity of threshold voltage values in the first distribution 336-1 is equal to an estimated weight of the codeword 332. Further, the sorted threshold voltage values can be divided into the first distribution 336-1 and the second distribution 336-2 such that the quantity of the threshold voltage values in the second distribution 336-2 is equal to a difference between the quantity of memory cells in the codeword 332 and the quantity of the threshold voltage values in the first distribution 336-1.

Figure 4:
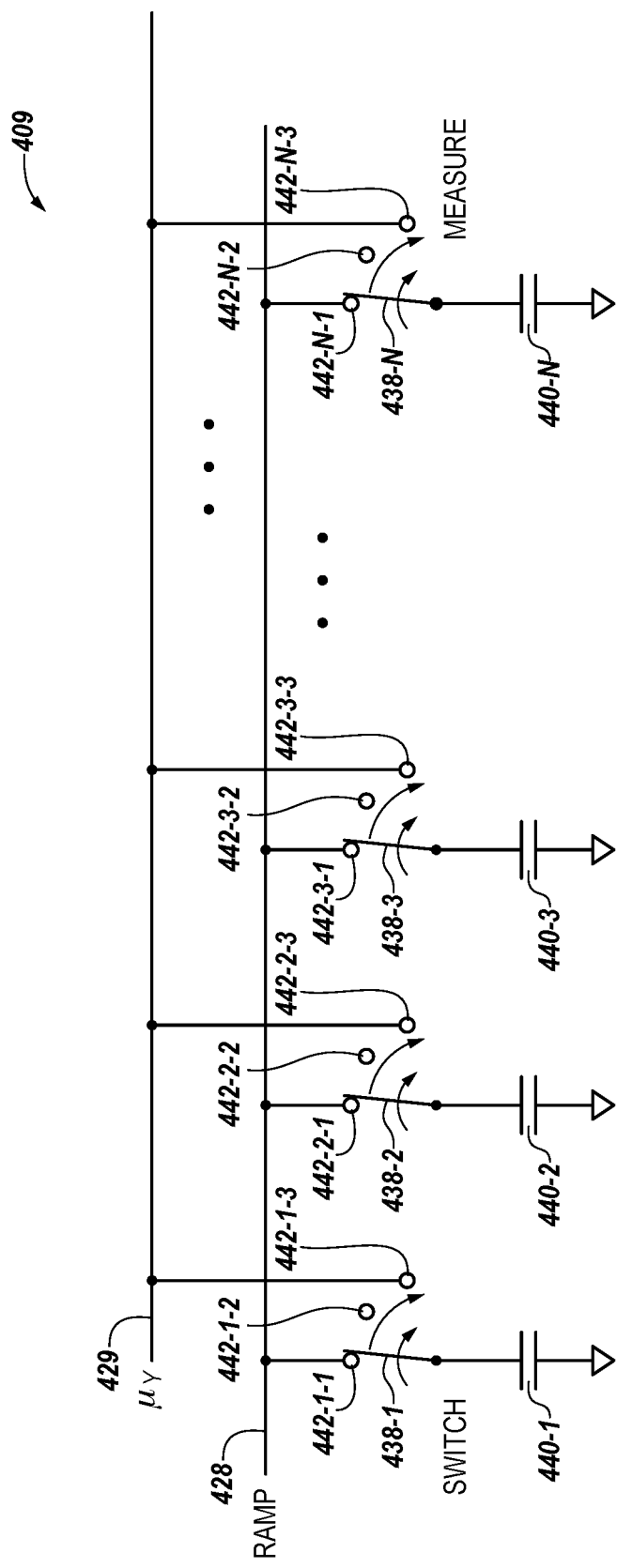
FIG. 4 illustrates circuitry for determining the mean threshold voltage value of memory cells corresponding to data bits in a codeword in accordance with an embodiment of the present disclosure.

FIG. 4 illustrates circuitry 409 for determining the mean threshold voltage value of memory cells corresponding to data bits in a codeword in accordance with an embodiment of the present disclosure. Circuitry 409 can be, for instance, circuitry 209 previously described in connection with FIG. 2. As shown in FIG. 4, circuitry 409 includes a mean voltage line 429, a ramp voltage line 428, switches 438-1, 438-2, 438-3, ..., 438-N (individually or collectively referred to as switches 438), connectors 442-1-1, 442-1-2, 442-1-3, . . . , 442-N-1, 442-N-2, and 442-N-3 (individually or collectively referred to as connectors 442), and capacitors 440-1, 440-2, 440-3, . . . , 440-N (individually or collectively referred to as capacitors 440).

Each respective one of the plurality of switches 438 can be configured to couple a different one of the memory cells of memory array 201 previously described in connection with FIG. 2 to a different one of a plurality of connectors 442. The ramped voltage line 428 can output a ramped voltage (e.g., ramped voltage 328 previously described in connection with FIG. 3), and each of the memory cells can be coupled to the ramped voltage via the ramp voltage line 428 when its respective switch 438 is coupled to a first connector 442-1-1, 442-2-1, 442-3-1, . . . , 442-N-1 of the plurality of connectors 442 (e.g., the memory cell coupled to switch 438-1 can be coupled to ramp voltage line 428 when switch 438-1 is coupled to first connector 442-1-1, the memory cell coupled to switch 438-2 can be coupled to ramp voltage line 428 when switch 438-2 is coupled to first connector 442-2-1, etc.). In some embodiments, each of the plurality of switches 438 can be coupled to its respective first connector (e.g., to the ramp voltage line 428) until its corresponding memory cell reaches its threshold voltage. Each memory cell that is coupled to the ramp voltage line 428 may experience a switching event when it reaches its threshold voltage.

In some embodiments, each respective one of the plurality of switches 438 can be configured to decouple from the first connector 442-1-1, 442-2-1, 442-3-1, . . . , 442-N-1 and couple to a second connector 442-1-2, 442-2-2, 442-3-2, . . . , 442-N-2 of the plurality of connectors once its respective memory cell experiences a switching event (e.g., switch 438-1 can decouple from first connector 442-1-1 and couple to second connector 442-1-2 once the memory cell coupled to switch 438-1 experiences a switching event, switch 438-2 can decouple from first connector 442-2-1 and couple to second connector 442-2-2 once the memory cell coupled to switch 438-2 experiences a switching event, etc.). In some embodiments, the switches 438 can couple to the second connector 442-1-2, 442-2-2, 442-3-2, . . . , 442-N-2 to store the voltage level of the corresponding memory cells (e.g., the threshold voltage of the cells when they experience the switching event) in capacitors 440. For example, once the memory cell that is coupled to switch 438-1 reaches its threshold voltage and experiences a switching event, switch 438-1 can decouple from the first connector 442-1-1 and couple to the second connector 442-1-2 to store the voltage of that memory cell in capacitor 440-1, while the other switches 438 can remain connected to their respective first connector.

In some embodiments, each respective one of the plurality of switches 442 can be configured to decouple form the second connector 442-1-2, 442-2-2, 442-3-2, . . . , 442-N-2 and couple to a third connector 442-1-3, 442-2-3, 442-3-3, . . . , 442-N-3 of the plurality of connectors once each (e.g., every) memory cell experiences a switching event. As shown in FIG. 4, coupling the switches 438 to the third connector 442-1-3, 442-2-3, 442-3-3, . . . , 442-N-3 couples the switches 438, and therefore the capacitors 440, to the mean voltage line 429. In some embodiments, each of the plurality of switches 438 can be configured to couple to its respective third connector 442-1-3, 442-2-3, 442-3-3, . . . , 442-N-3 simultaneously. In some embodiments, each of the memory cells can be coupled to a common node when each of the plurality of switches 438 is coupled to its respective third connector 442-1-3, 442-2-3, 442-3-3, . . . , 442-N-3.

Controller 204 and/or control circuitry 224 previously described in connection with FIG. 2 can be configured to determine the mean of the threshold voltage values of the memory cells when each of the plurality of switches 438 is coupled to its respective third connector 442-1-3, 442-2-3, 442-3-3, . . . , 442-N-3. The controller and/or control circuitry can determine the mean of the threshold voltage values of the memory cells by measuring the total voltage value stored by the capacitors 440 coupled to the mean voltage line 429 and dividing that value by the number of memory cells.

Figure 5:
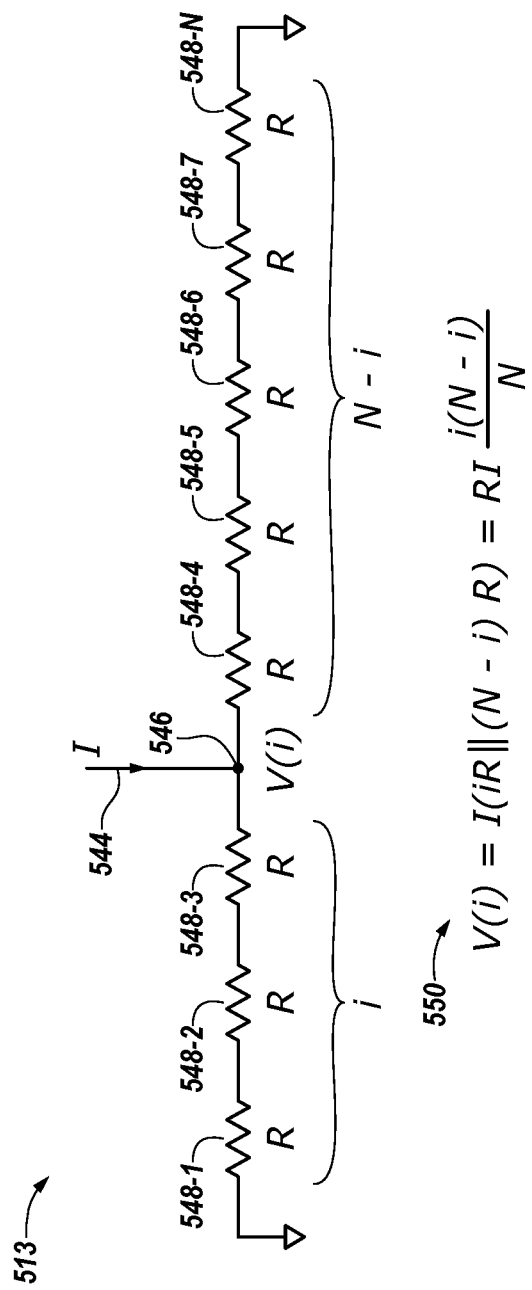
FIG. 5 illustrates circuitry for determining a parabolic term of a codeword in accordance with an embodiment of the present invention.

FIG. 5 illustrates circuitry 513 for determining a parabolic term of a codeword in accordance with an embodiment of the present invention. Circuitry 513 can be, for example, parabolic term circuitry 213 previously described in connection with FIG. 2. The parabolic term circuitry 513 can include a plurality of resistors 548-1, 548-1, . . . , 548-N (individually or collectively referred to as resistors 548) coupled in series, a current (e.g., current supply) 544, and a node 546 between two of the resistors 548.

The current 544 can be applied to node 546. In the embodiment shown in FIG. 5, the current 544 is applied to the node 546 between resistors 548-3 and 548-4. However, the current 544 can be applied to a node 546 between any two adjacent resistors 548. In some embodiments, each resistor 548 can correspond to a data bit (e.g., data bit 334 in FIG. 3) in a codeword (e.g., codeword 332 in FIG. 3). In the embodiment shown in FIG. 5, resistor 548-3 corresponds to a third data bit in the codeword and resistor 548-4 corresponds to a fourth data bit in the codeword. In some embodiments, the parabolic term circuitry 513 can include transistors instead of resistors 548.

In some embodiments, the value of the voltage at the node 546 when the current 544 is applied to the node 546 can be determined via the equation 550. The equation 550 states the value of the voltage at the node 546 can be found by multiplying a resistance R of a resistor 548 corresponding to the node by the value I of the current 544. The value of that operation can be multiplied by the value of an operation that multiplies the number i of resistors 548 before the node 546 (e.g., the node to which the current 544 was applied) in the series of resistors to the number N-i of resistors 548 after the node 546 in the series of resistors and divides that value by the number of data bits N (e.g., the number of memory cells) in the corresponding codeword. The parabolic term can be found by determining the value of the voltage at each node between the resistors 548 when the current 544 is applied to each node 546.

Figure 6:
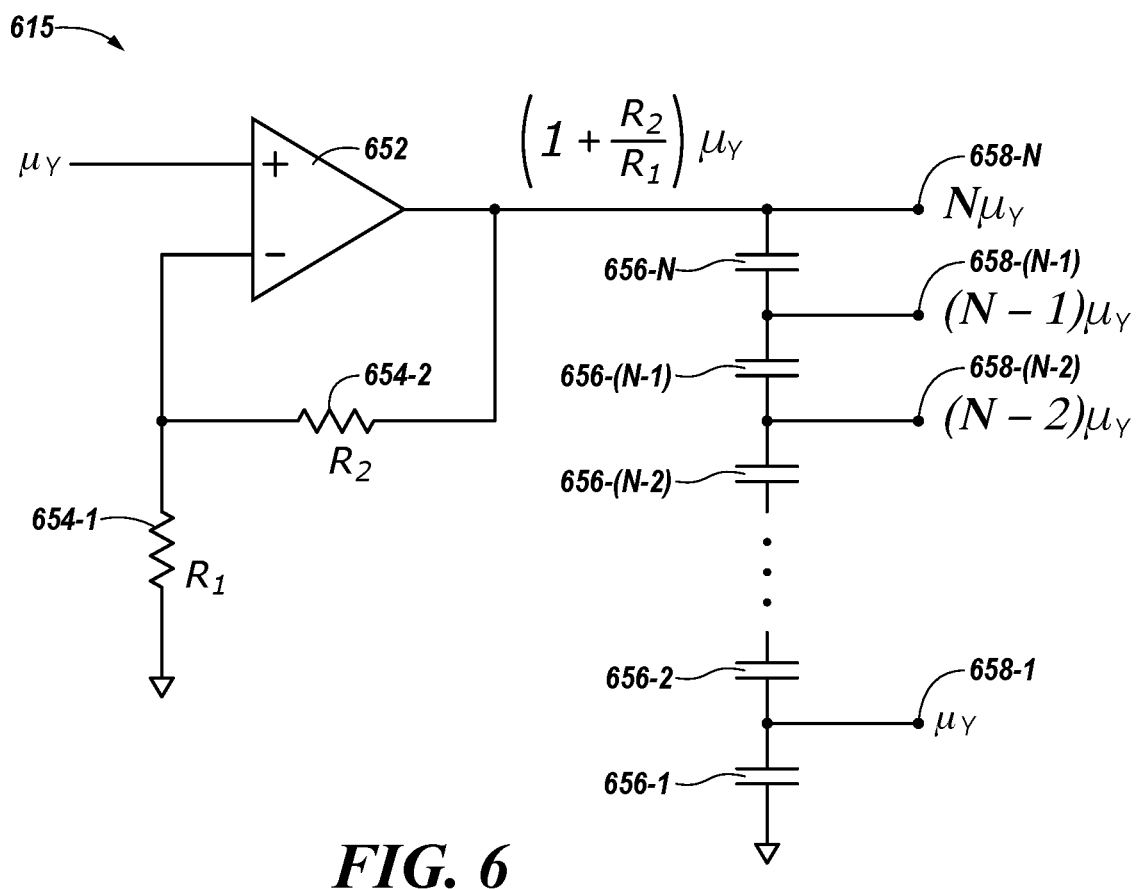
FIG. 6 illustrates circuitry for determining a term proportional to the mean threshold voltage value of memory cells corresponding to data bits in a codeword in accordance with an embodiment of the present invention.

FIG. 6 illustrates circuitry 615 for determining a term proportional to the mean threshold voltage value of memory cells corresponding to data bits of a codeword in accordance with an embodiment of the present invention. Circuitry 615 can be, for example, proportional term circuitry 215 previously described in connection with FIG. 2. The proportional term circuitry 615 can include a buffer 652, a plurality of resistors 654-1 and 654-2, and a plurality of capacitors 656-1, 656-2, . . . , 656-N.

In some embodiments, the proportional term circuitry 615 can be used to determine a value that is proportional to the mean of the threshold voltage values. The value proportional to the mean can be determined by inputting the mean of threshold voltages values into the buffer 652. In some embodiments, the first resistor 654-1 can be coupled to an input of the buffer 652 and a second resistor 654-2 is coupled to first resistor 654-1 and an output of the buffer 652. Further, in some embodiments, the buffer 652 can output a voltage to each of a plurality of nodes 658-1, 658-2, . . . , 658-N (individually or collectively referred to as nodes 658) that couple each of the plurality of capacitors 656 (e.g., node 658-2 couples capacitors 656-1 and 656-2, node 658-3 couples capacitors 656-2 and 656-3, etc.).

As shown in FIG. 6, the proportional term circuitry 615 can be configured such that the output of the buffer 652 is equal to the mean threshold voltage value of the memory cells corresponding to data bits in the codeword (e.g., the mean threshold voltage value determined by mean circuitry 409 described in connection with FIG. 4) multiplied by the result of an operation that adds a value of 1 to the quotient of the resistance $R_2$ of the second resistor 654-2 divided by the resistance $R_1$ of the first resistor 654-1. In some embodiments, the result of this operation can be equal to the number of data bits in the codeword. As represented by nodes 658-1, . . . , 658-(N-2), 658-(N-1), 658-N, the term proportional to the mean can be found for each data bit in the codeword. For example, the term proportional to the mean can be found for the last data bit in the codeword at node 658-N. Further, the term proportional to the mean for the first data bit can be found at node 658-1.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device, comprising:
      an array of memory cells; and
      circuitry configured to:
         sense a codeword stored in the array of memory cells;
         determine a value of a cell metric of each memory cell of the sensed codeword, wherein the value of the cell metric of each of the memory cells is determined based on:
            a summation of a threshold voltage value of each of the memory cells;
            a mean of the threshold voltage values of the memory cells; and
            a value proportional to the mean of the threshold voltage values of the memory cells;
         determine which cell metric of each of the memory cells has a lowest value;
         input the cell metric determined to have the lowest value to a Pearson detector; and
         determine originally programmed data of the codeword using the Pearson detector.

2. The apparatus of claim 1, wherein the value of the cell metric determined to have the lowest value and a correlation between a tentative codeword and the sensed codeword are input into the Pearson detector to determine the originally programmed data of the codeword.

3. The apparatus of claim 1, wherein the sensed codeword comprises a sensed data value of each of the memory cells of the sensed codeword.

4. The apparatus of claim 1, wherein the originally programmed data of the codeword comprises a programmed data value of each of the memory cells of the codeword.

5. A method, comprising:
   sensing a codeword stored in an array of memory cells of a memory device;
   determining, by the memory device, for each memory cell of the sensed codeword, a value of a cell metric of each of the memory cells of the sensed codeword, wherein the value of the cell metric of each of the memory cells of the sensed codeword is determined based on:
      a summation of a threshold voltage value of each of the memory cells;
      a mean of the threshold voltage values of the memory cells; and
      a value proportional to the mean of the threshold voltage values of the memory cells;
   determining, by the memory device, which cell metric of each of the memory cells has a lowest value;
   inputting the cell metric determined to have the lowest value to a Pearson detector; and
   determining originally programmed data of the codeword using the Pearson detector.

6. The method of claim 5, further comprising determining the threshold voltage value of each of the memory cells after a switching event occurs in each of the memory cells.

7. The method of claim 6, further comprising initiating the switching event in each of the memory cells by applying a ramped voltage to the memory cells.

8. The method of claim 5, further comprising sorting the threshold voltage values of each of the memory cells in ascending order.

9. The method of claim 8, further comprising dividing the sorted threshold voltage values into a first distribution and a second distribution.

10. The method of claim 9, wherein the sorted threshold voltage values are divided into the first distribution and the second distribution such that a quantity of the threshold voltage values in the first distribution is equal to an estimated weight of the codeword.

11. The method of claim 9, wherein the sorted threshold voltage values are divided into the first distribution and the second distribution such that a quantity of the threshold voltage values in the second distribution is equal to a difference between a quantity of memory cells in the codeword and a quantity of the threshold voltage values in the first distribution.

12. An apparatus, comprising:
a memory device comprising an array of memory cells; and
a controller coupled to the memory device and configured to:
  sense a codeword stored in the array of memory cells;
  determine, for each memory cell of the sensed codeword in the memory device, a value of a cell metric of each of the memory cells of the sensed codeword, wherein the value of the cell metric of each of the memory cells of the codeword is determined based on:
    a summation of a threshold voltage value of each of the memory cells;
    a mean of the threshold voltage values of the memory cells; and
    a value proportional to the mean of the threshold voltage values of the memory cells;
  determine which cell metric of each of the memory cells has a lowest value; and
  input the cell metric determined to have the lowest value to a Pearson detector; and
  determine originally programmed data of the codeword using the Pearson detector.

13. The apparatus of claim 12, wherein the Pearson detector determines the originally programmed data of the codeword by searching for a codeword that has a lowest Pearson distance from the codeword relative to other codewords.

14. The apparatus of claim 13, wherein the Pearson detector determines the lowest Pearson distance using a weight estimator.

15. The apparatus of claim 12, wherein the memory device includes a plurality of switches, wherein each respective one of the plurality of switches is configured to couple a different one of the memory cells to a different one of a plurality of connectors.

16. The apparatus of claim 15, wherein each of the memory cells is coupled to a ramped voltage when its respective switch is coupled to a first connector of the plurality of connectors.

17. The apparatus of claim of claim 16, wherein each respective one of the plurality of switches is configured to decouple from the first connector and couple to a second connector of the plurality of connectors once its respective memory cell experiences a switching event.

18. The apparatus of claim 17, wherein each respective one of the plurality of switches is configured to decouple from the second connector and couple to a third connector when each of the plurality of memory cells experiences the switching event.

19. The apparatus of claim 18, wherein each of the plurality of memory cells is coupled to a common node when each of the plurality of switches is coupled to its respective third connector.

20. The apparatus of claim 18, wherein the controller is configured to determine the mean of the threshold voltage values of the memory cells when each of the plurality of switches is coupled to its respective third connector.

21. The apparatus of claim 18, wherein each of the plurality of switches are configured to couple to its respective third connector simultaneously.

22. A method, comprising:
sensing a codeword stored in an array of memory cells of a memory device;
determining, by a controller coupled to the memory device, for each memory cell of a sensed codeword in the memory device, a value of a cell metric of each memory cell of the codeword, wherein the value of the cell metric of each memory cell of the codeword is based on:
  a summation of a threshold voltage value of each of the memory cells;
  a mean of the threshold voltage values of the memory cells; and
  a value proportional to the mean of the threshold voltage values of the memory cells;
determining, by the controller, which cell metric of each of the memory cells has a lowest value;
inputting the cell metric determined to have the lowest value to a Pearson detector; and
determining originally programmed data of the codeword using the Pearson detector.

23. The method of claim 22, further comprising determining the value proportional to the mean of the threshold voltage values via circuitry that comprises a buffer, a plurality of resistors, and a plurality of capacitors.

24. The method of claim 23, wherein the method includes determining the value proportional to the mean of the threshold voltage values by inputting the mean of the threshold voltage values into the buffer, wherein:
  a first resistor is coupled to an input of the buffer and a second resistor is coupled to an output of the buffer; and
  the buffer outputs a voltage to each of a plurality of nodes that couple each of the plurality of capacitors.

25. The method of claim 21, further comprising adding a data bit having a first value to the codeword if the sensed codeword only comprises data bits having a second value.

* * * * *